United States Patent
Xiao et al.

(10) Patent No.: US 12,363,889 B2
(45) Date of Patent: Jul. 15, 2025

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 553 days.

(21) Appl. No.: 17/817,412

(22) Filed: Aug. 4, 2022

(65) Prior Publication Data

US 2023/0170416 A1   Jun. 1, 2023

(30) Foreign Application Priority Data

Nov. 30, 2021 (CN) .......................... 202111440471.0

(51) Int. Cl.
*H10B 12/00* (2023.01)
*H10D 30/01* (2025.01)
(Continued)

(52) U.S. Cl.
CPC ......... *H10B 12/488* (2023.02); *H10D 30/025* (2025.01); *H10D 30/63* (2025.01); *H10D 30/6735* (2025.01); *H10D 64/518* (2025.01)

(58) Field of Classification Search
CPC .... H10B 12/488; H10D 30/025; H10D 30/63; H10D 62/122
See application file for complete search history.

(56) References Cited

U.S. PATENT DOCUMENTS 9,112,032 B1   8/2015 Liu et al.
9,318,576 B2   4/2016 Park
(Continued)

FOREIGN PATENT DOCUMENTS

CN   104425608 A   3/2015
CN   108389896 A   8/2018
(Continued)

OTHER PUBLICATIONS

First Office Action cited in CN202111444498.7 mailed May 16, 2022, 23 pages.
(Continued)

*Primary Examiner* — Peter M Albrecht
(74) *Attorney, Agent, or Firm* — Kilpatrick Townsend & Stockton LLP (57) ABSTRACT

The present disclosure provides a manufacturing method of a semiconductor structure and a semiconductor structure. The manufacturing method of a semiconductor structure includes: providing a substrate; forming an silicon pillar on the substrate; pre-processing the silicon pillar, to form an active pillar including a first segment, a second segment, and a third segment, where the second segment includes a first sub-segment and a second sub-segment, and a cross-sectional area of the second sub-segment is smaller than that of the first sub-segment; forming a gate oxide layer; and forming a word line structure surrounding the second segment, where the word line structure includes a first word line structure and a second word line structure that are made of different materials.

15 Claims, 7 Drawing Sheets

(51) Int. Cl.
*H10D 30/63* (2025.01)
*H10D 30/67* (2025.01)
*H10D 64/27* (2025.01)

(56) References Cited

U.S. PATENT DOCUMENTS

| | | |
|---|---|---|
| 2006/0043472 A1 | 3/2006 | Wang et al. |
| 2007/0082448 A1 | 4/2007 | Kim et al. |
| 2011/0007578 A1* | 1/2011 | Okhonin ................ H10B 12/00 |
| | | 365/189.09 |
| 2011/0121396 A1 | 5/2011 | Lee |
| 2021/0296316 A1 | 9/2021 | Zhu |

FOREIGN PATENT DOCUMENTS

| | | | |
|---|---|---|---|
| CN | 108807545 A | 11/2018 | |
| CN | 109449158 A | 3/2019 | |
| CN | 109841522 A | 6/2019 | |
| CN | 109979880 A | 7/2019 | |
| CN | 113611671 A | 11/2021 | |
| KR | 100660891 B1 * | 12/2006 | ......... H10B 12/0383 |

OTHER PUBLICATIONS

International Search Report cited in PCT/CN2022/077639 mailed May 19, 2022, 9 pages.
International Search Report cited in PCT/CN2022/077681 mailed Aug. 9, 2022, 8 pages.

\* cited by examiner

MANUFACTURING METHOD OF SEMICONDUCTOR STRUCTURE AND SEMICONDUCTOR STRUCTURE

CROSS-REFERENCE TO RELATED APPLICATION

This application claims the priority of Chinese Patent Application No. 202111440471.0, submitted to the Chinese Intellectual Property Office on Nov. 30, 2021, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure, including:
providing a substrate;
forming silicon pillars on the substrate, where the silicon pillars are arranged in an array;
pre-processing the silicon pillar, to form an active pillar, where along a first direction, the active pillar includes a first segment, a second segment, and a third segment that are connected sequentially, and the second segment includes a first sub-segment and a second sub-segment that are connected sequentially, and along a second direction, a cross-sectional area of the second sub-segment is smaller than that of the first sub-segment;
forming a gate oxide layer on a sidewall of the second segment and a bottom surface of the third segment; and
forming a word line structure on a sidewall of the gate oxide layer, where the word line structure surrounds the second segment and includes a first word line structure and a second word line structure that are connected sequentially along the first direction, the first word line structure is connected to the sidewall of the gate oxide layer and covers the second word line structure, and the first word line structure and the second word line structure are made of different materials.

A second aspect of the present disclosure provides a semiconductor structure, including:
a substrate;
active pillars, arranged as an array in the substrate, where along a first direction, the active pillar includes a first segment, a second segment, and a third segment that are connected sequentially, and the second segment includes a first sub-segment and a second sub-segment that are connected sequentially, and along a second direction, a cross-sectional area of the second sub-segment is smaller than that of the first sub-segment;
a gate oxide layer, disposed on a sidewall of the second segment and a bottom surface of the third segment; and
a word line structure, where the word line structure surrounds the second segment and includes a first word line structure and a second word line structure, the first word line structure is connected to a sidewall of the gate oxide layer and covers the second word line structure, and the first word line structure and the second word line structure are made of different materials.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A dynamic random access memory (DRAM) is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In a semiconductor structure, the transistor can be understood as a current switch structure made of a semiconductor material. A metal gate is disposed between the source and the drain of the transistor, and the metal gate can be used to control on/off of a current between the source and the drain. A gate-all-around (GAA) transistor is made by using a GAA technology. With the development of semiconductor processes, a size of a semiconductor device is becoming smaller. In addition, GIDL occurs in a process of forming the GAA transistor, reducing performance and a yield of the semiconductor structure.

To resolve one of the foregoing technical problems, an exemplary embodiment of the present disclosure provides a manufacturing method of a semiconductor structure. The following describes the manufacturing method of a semiconductor structure with reference to FIGS. 1 to 19.

The semiconductor structure is not limited in this embodiment. The semiconductor structure is described below by using a DRAM as an example, but this embodiment is not limited thereto. Alternatively, the semiconductor structure in this embodiment may further be another structure.

Figure 1:
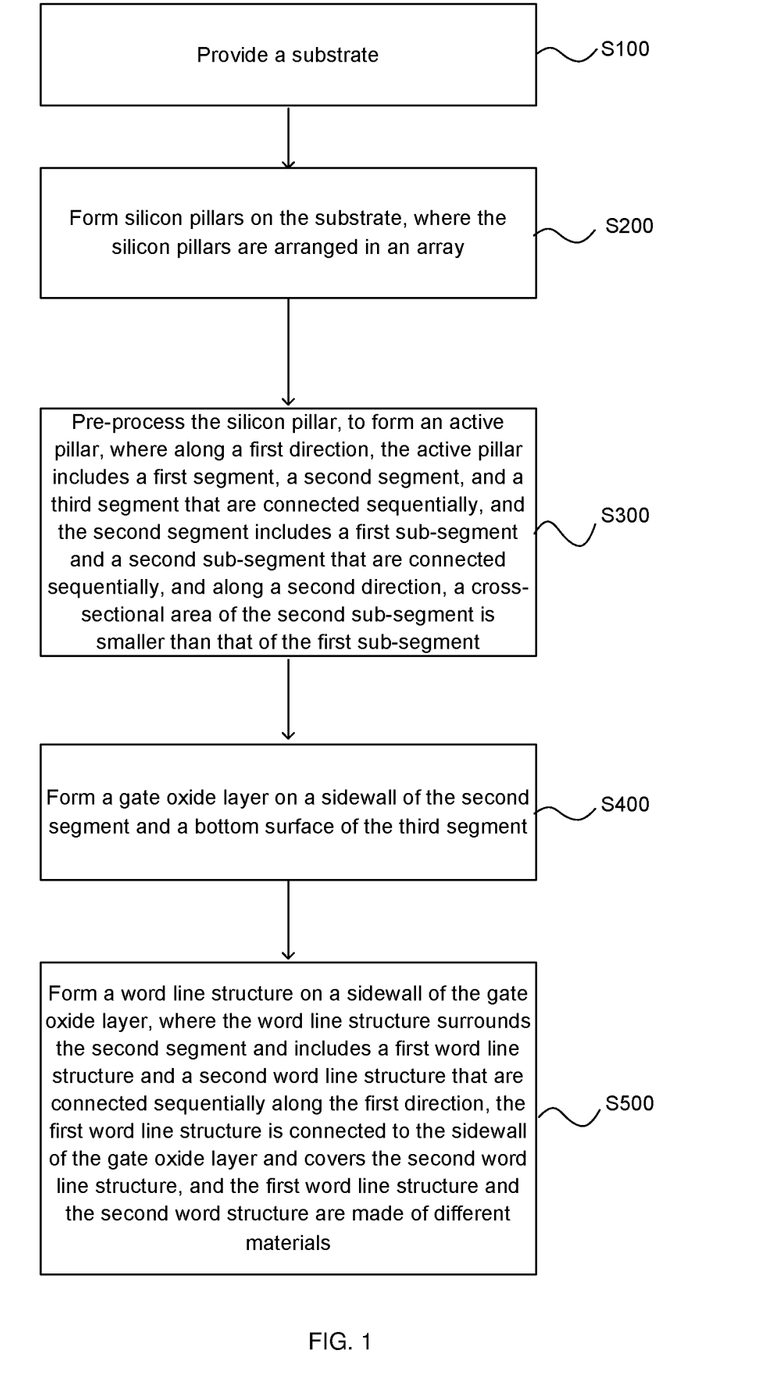
FIG. 1 is a flowchart of a manufacturing method of a semiconductor structure according to an exemplary embodiment.

As shown in FIG. 1, an exemplary embodiment of the present disclosure provides a manufacturing method of a semiconductor structure, including the following steps:

Step S100: Provide a substrate.

Step S200: Form silicon pillars on the substrate, where the silicon pillars are arranged in an array.

Step S300: Pre-process the silicon pillar, to form an active pillar, where along a first direction, the active pillar includes a first segment, a second segment, and a third segment that are connected sequentially, and the second segment includes a first sub-segment and a second sub-segment that are connected sequentially, and along a second direction, a cross-sectional area of the second sub-segment is smaller than that of the first sub-segment.

Step S400: Form a gate oxide layer on a sidewall of the second segment and a bottom surface of the third segment.

Step S500: Form a word line structure on a sidewall of the gate oxide layer, where the word line structure surrounds the second segment and includes a first word line structure and a second word line structure that are connected sequentially along the first direction, the first word line structure is connected to the sidewall of the gate oxide layer and covers the second word line structure, and the first word line structure and the second word line structure are made of different materials.

In this embodiment, the gate oxide layer is formed on the sidewall of the second segment and the bottom surface of the third segment. The first word line structure and the second word line structure that are made of different materials are disposed on the gate oxide layer. The word line structures covering the first sub-segment and the second sub-segment respectively have different thicknesses, such that potentials at two ends of the second segment are different, which is beneficial to controlling the turn-off current of the semiconductor structure, and reducing the problems of GIDL and inter-band tunneling, thereby effectively improving the performance and yield of the semiconductor structure.

According to an exemplary embodiment, this embodiment is a further description of step S100 described above.

Figure 2:
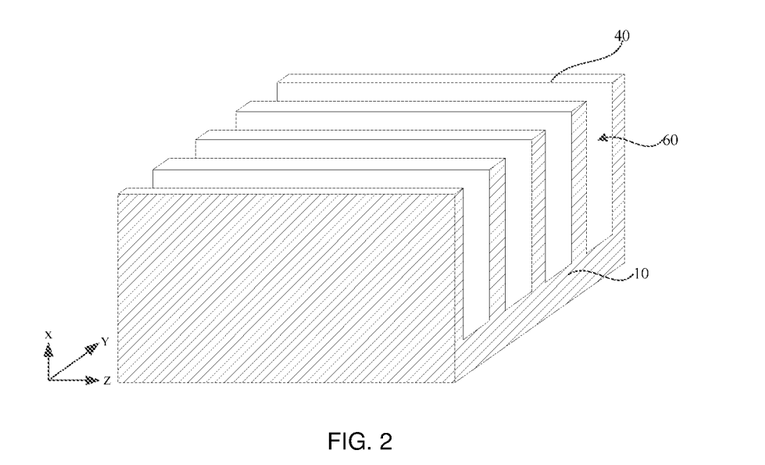
FIG. 2 is a schematic diagram of forming a strip body in the manufacturing method of a semiconductor structure according to an exemplary embodiment.

As shown in FIG. 2, the substrate 10 is provided. The substrate 10 serves as a support member of a DRAM and is configured to support other components provided thereon. The substrate 10 may be made of a semiconductor material. The semiconductor material may be one or more of silicon, germanium, a silicon-germanium compound, and a silicon-carbon compound. In this embodiment, the substrate 10 is made of silicon. Silicon is used as the substrate 10 in this embodiment is to facilitate understanding of a subsequent forming method for those skilled in the art, rather than to constitute a limitation. In an actual application process, an appropriate material of the substrate may be selected as required.

According to an exemplary embodiment, this embodiment is a further description of step S200 described above.

In some embodiments, the silicon pillars 20 are formed on the substrate 10. A plurality of silicon pillars 20 are provided and arranged in an array on the substrate 10. In other words, the plurality of silicon pillars 20 may be arranged in a plurality of rows and a plurality of columns.

In some embodiments, the silicon pillars 20 arranged as the array may be formed on the substrate 10 by using the following method.

With reference to FIG. 2, a bit line isolation structure 30 is formed in the substrate 10. A plurality of bit line isolation structures 30 are provided and arranged at intervals along a second direction Y With reference to FIG. 2, using an orientation shown in the figure as an example, the second direction Y is perpendicular to a front side surface of the substrate 10. The substrate 10 between adjacent two of the bit line isolation structures 30 forms a strip body 40. The bit line isolation structure 30 formed in the substrate 10 can insulate adjacent bit lines formed subsequently in the substrate 10, and ensure performance and a yield of a semiconductor structure.

As shown in FIG. 2, in some embodiments, the bit line isolation structure 30 may be formed by using the following method.

A mask layer with a mask pattern may be formed first on the substrate 10. Along the extension direction from the top surface of the substrate 10 to the bottom surface of the substrate 10, a part of the substrate 10 is removed based on the mask pattern to form the plurality of bit line trenches 60 disposed at intervals along the second direction Y Then, the initial bit line isolation structure 31 is formed in the bit line trench 60 by using an atomic layer deposition process, a chemical vapor deposition process, or a physical vapor deposition process.

Next, along the extension direction from the top surface of the substrate 10 to the bottom surface of the substrate 10, a part of the initial bit line isolation structure 31 is removed through etching. The retained initial bit line isolation structure 31 forms the bit line isolation structure 30. It should be noted that, with reference to FIGS. 3 to 11, the initial bit line isolation structure 31 may be etched once or a plurality of times by a predetermined depth for removal to form the bit line isolation structure 30. A material of the bit line isolation structure 30 may include, but is not limited to, silicon oxide or silicon nitride. In some embodiments, the bit line isolation structure 30 may alternatively be of an oxide-nitride-oxide (ONO) structure, but is not limited thereto.

In this embodiment, the initial bit line isolation structure 31 is formed first, and then is partially removed through etching. The retained initial bit line isolation structure forms the bit line isolation structure 30. The method for forming the bit line isolation structure 30 is simple, and facilitates controlling its size, to ensure that adjacent bit lines formed subsequently in the substrate 10 are insulated, thereby ensuring the performance and yield of the semiconductor structure.

Figure 3:
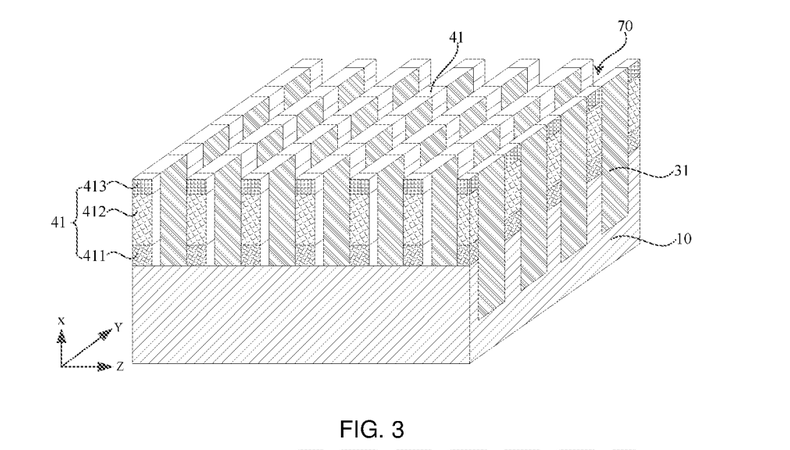
FIG. 3 is a schematic diagram of forming a silicon pillar structure in the manufacturing method of a semiconductor structure according to an exemplary embodiment.

With reference to FIG. 3, the strip body 40 is processed to form the silicon pillar structure 41. Along a first direction X, the silicon pillar structure 41 includes a first part 411, a second part 412, and a third part 413 that are sequentially connected. The first part 411 is connected to the substrate 10. With reference to FIG. 3, using an orientation shown in the figure as an example, the first direction X is an extension direction from a bottom surface of the substrate 10 to a top surface of the substrate 10.

In some embodiments, the strip body 40 is processed by using, for example, an ion implantation process. For example, ion implantation energy and a type of implanted doped ions can be controlled three times in an ion implantation process, to sequentially form a first part 411 at the bottom of the silicon pillar structure 41, a second part 412 in the middle of the silicon pillar structure 41 and a third part 413 on the top of the silicon pillar structure 41. The first part 411 and the third part 413 may be doped with a same type of ions, such as N-type ions. The second part 412 and the drain region are doped with different types of ions, which may include P-type ions.

It should be noted that the first part 411 may be used as one of a source region and a drain region of the active pillar 140 formed subsequently. The second part 412 may be used as a channel region of the active pillar 140. The third part 413 may be used as the other of the source region and the drain region of the active pillar 140. For example, if the first part 411 is used as the source region, correspondingly, the third part 413 is used as the drain region.

Figure 6:
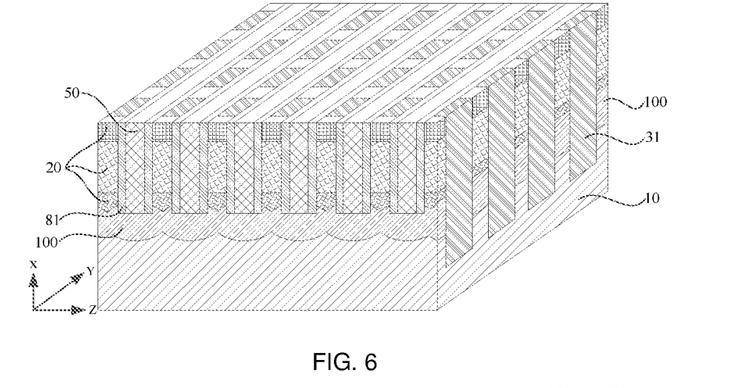
FIG. 6 is a schematic diagram of forming a word line isolation structure and a silicon pillar in the manufacturing method of a semiconductor structure according to an exemplary embodiment.

As shown in FIG. 6, after the silicon pillar structure 41 is formed, a plurality of word line isolation structures 50 are formed in the substrate 10. The plurality of word line isolation structures 50 are disposed at intervals along a third direction Z. With reference to FIG. 6, using an orientation shown in the figure as an example, the third direction Z is an extension direction parallel to the front side surface of the substrate 10. The second direction Y intersects the third direction Z on a same horizontal plane. The second direction Y may intersect the third direction Z at a predetermined angle. For example, the second direction Y is mutually perpendicular to the third direction Z.

After the word line isolation structure 50 is formed, the silicon pillar structure 41 between adjacent word line isolation structures 50 and between adjacent bit line isolation structures 30 forms the silicon pillar 20 on the substrate 10. The word line isolation structure 50 can insulate adjacent bit lines formed subsequently in the substrate 10, thereby ensuring the performance and the yield of the semiconductor structure.

Figure 4:
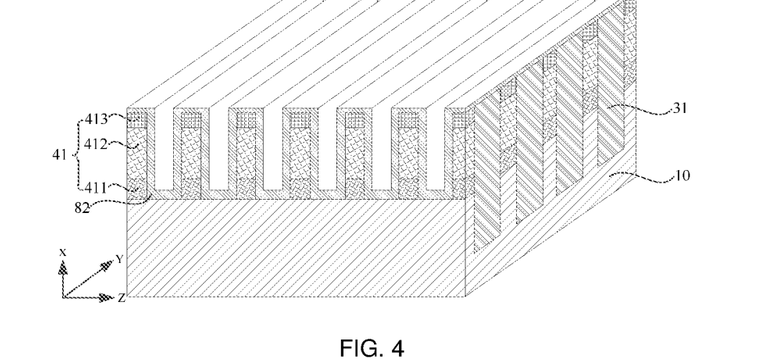
FIG. 4 is a schematic diagram of forming a first sacrificial dielectric layer in the manufacturing method of a semiconductor structure according to an exemplary embodiment.
Figure 5:
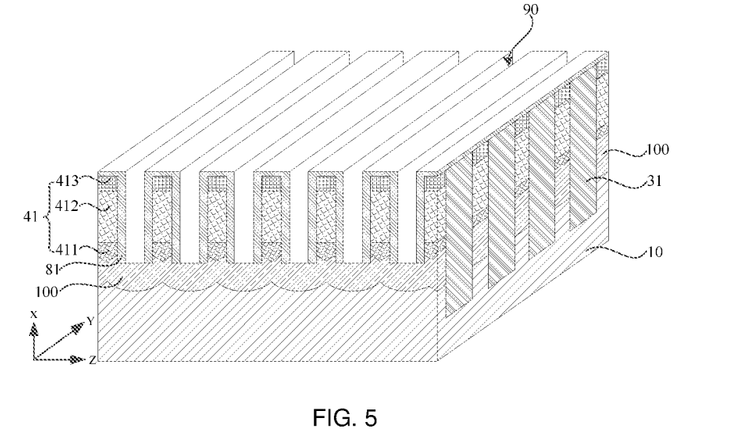
FIG. 5 is a schematic diagram of forming a first initial dielectric layer, a first trench, and a bit line in the manufacturing method of a semiconductor structure according to an exemplary embodiment.

With reference to FIGS. 4 to 6, in some embodiments, the word line isolation structure 50 may be formed by using the following method.

A mask layer with a mask pattern may be formed first on the top surface of the substrate 10. Along the extension direction from the top surface of the substrate 10 to the bottom surface of the substrate 10, a part of the substrate 10 is removed based on the mask pattern to form the plurality of word line trenches 70 disposed at intervals along the third direction Z. The word line trench 70 is shallower than the bit line trench 60.

Then, a first initial dielectric layer 81 is formed on a sidewall of the word line trench 70 by using the atomic layer deposition process, the chemical vapor deposition process, or the physical vapor deposition process. The first initial dielectric layer 81 extends to the outside of the word line trench 70 and covers the top surface of the silicon pillar structure 41.

In a process of forming the first initial dielectric layer 81, as shown in FIG. 4, a first sacrificial dielectric layer 82 is formed first on the sidewall of the word line trench 70, at the bottom of the word line trench 70, on a top surface of the silicon pillar structure 41, and on a top surface of the bit line isolation structure 30 by using the atomic layer deposition process. Then, along the first direction X, the first sacrificial dielectric layer 82 at the bottom of the word line trench 70 is removed through etching, and the retained first sacrificial dielectric layer 82 on the sidewall of the word line trench 70, the top surface of the silicon pillar structure 41, and the top surface of the bit line isolation structure 30 forms the first initial dielectric layer 81. A material of the first initial dielectric layer 81 may include, but is not limited to silicon nitride, silicon dioxide, or silicon oxynitride. A first trench 90 is formed between first initial dielectric layers 81 on the sidewalls of the word line trench 70.

The first initial dielectric layer 81 can protect a sidewall and the top surface of the silicon pillar structure 41 to prevent another structure formed subsequently in the substrate 10 from causing a damage to a silicon pillar 20.

Then, the word line isolation structure 50 is formed in the first trench 90. With reference to FIG. 5, before the word line isolation structure 50 is formed in the first trench 90, a bit line 100 is formed at the bottom of the first trench 90. A plurality of bit lines 100 are provided and arranged at intervals along the second direction Y Cobalt (Co), a nickel platinum (NiPt) alloy, or the like may be implanted into the bottom of the first trench 90 by using the ion implantation process, and the Co or the NiPt alloy reacts with the substrate 10 to form cobalt silicide (CoSi) or platinum nickel silicide (PtNiSi). After annealed, the CoSi or the PtNiSi diffuses to a bottom surface of the active pillar 140 in the substrate 10 to form a bit line 100. The bit line 100 may be connected to first segments 141 of a plurality of active pillars 140 formed subsequently along the third direction Z in a same straight line.

The bit line forming method in this embodiment is simple and easy to control and operate. It should be noted that the bit line may be connected to the drain of the subsequently formed active pillar. In a transistor, a gate is connected to a word line, and a source is connected to a capacitor structure. The voltage signal on the word line is transmitted to the gate, such that the transistor is controlled to turn on or off, and data information stored in the capacitor structure is read through the bit line, or data information is written into the capacitor structure through the bit line for storage.

After the bit line 100 is formed, as shown in FIG. 6, a word line isolation structure 50 is formed in the first trench 90. A material is used to fill the first trench 90 by using the atomic layer deposition process, the chemical vapor deposition process, or the physical vapor deposition process, to form the initial word line isolation structure. A top surface of the initial word line isolation structure is flush with a top surface of the first initial dielectric layer 81. Suitable filling materials include an insulating material. In some embodiments, the filling material includes a nitride, an oxide, a high-k dielectric material, or another suitable insulating material.

After the initial word line isolation structure is formed, a part of the first initial dielectric layer 81 and a part of the initial word line isolation structure are removed through chemical mechanical polishing, to expose a top surface of the silicon pillar structure 41. The retained initial word line isolation structure forms the word line isolation structure 50. Through chemical mechanical polishing, a surface of the first initial dielectric layer 81, a surface of the word line isolation structure 50, and a surface of the silicon pillar are planarized, thereby reducing defect density and improving the yield of the semiconductor structure.

After the word line isolation structure 50 is formed, the silicon pillar structure 41 between adjacent word line isolation structures 50 and between adjacent bit line isolation structures 30 forms the silicon pillar 20 on the substrate 10. It should be noted that the first part 411 of the silicon pillar structure 41 forms a lower segment of the silicon pillar 20, the second part 412 of the silicon pillar structure 41 forms a middle segment of the silicon pillar 20, and the third part 413 of the silicon pillar structure 41 forms an upper segment of the silicon pillar 20. The word line isolation structure 50 is configured to insulate adjacent bit lines subsequently formed in the substrate 10, thereby ensuring the performance and the yield of the semiconductor structure.

Figure 7:
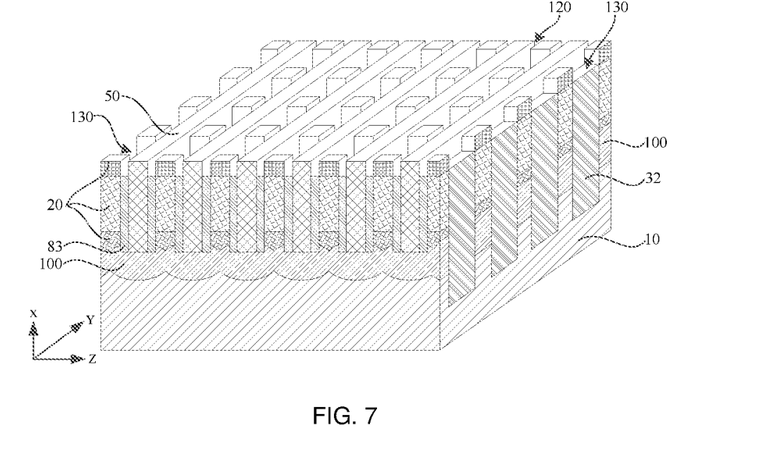
FIG. 7 is a schematic diagram of forming a first filling region and a second filling region in the manufacturing method of a semiconductor structure according to an exemplary embodiment.
Figure 8:
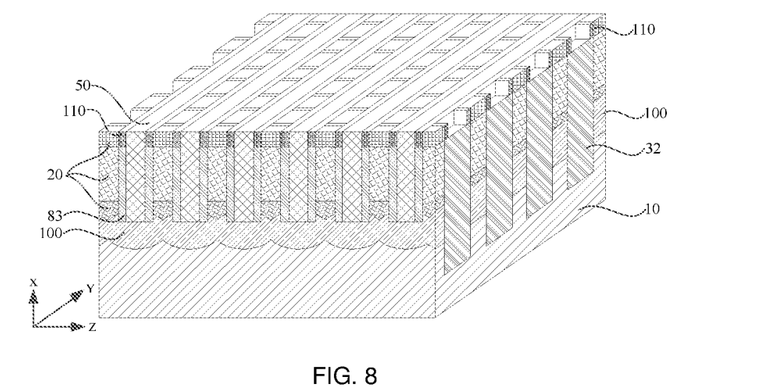
FIG. 8 is a schematic diagram of forming a support structure in the manufacturing method of a semiconductor structure according to an exemplary embodiment.

As shown in FIGS. 7 and 8, in some embodiments, to facilitate subsequent preprocessing on the silicon pillar 20 to form the active pillar, and improve accuracy of the subsequently formed gate oxide layer and other structures, a support structure 110 is formed on both sides of the word line isolation structure 50. The support structure 110 covers both sides of the word line structure and covers the two sidewalls of the third part 413 of the silicon pillar structure 41 extending along the third direction Z, that is, covers two side walls of the third segment of the active pillar formed subsequently extending along the third direction Z.

In some embodiments, with reference to FIG. 7, along the first direction X, the first initial dielectric layer 81 and the initial bit line isolation structure 31 are etched to partially remove the first initial dielectric layer 81 and the initial bit line isolation structure 31 and partially expose the word line isolation structure 50 and part of the silicon pillar structure 41. Along the third direction Z, the first filling region 120 is formed between the word line isolation structure 50 and the silicon pillar structure 41. Along the second direction Y, the gap between the third parts 413 of adjacent silicon pillar structures 41 forms a second filling region 130.

Then, with reference to FIG. 8, an initial support structure (not shown in the figure) is formed in the first filling region 120 and the second filling region 130 through the atomic layer deposition process, the chemical vapor deposition process, or the physical vapor deposition process.

In some embodiments, the initial support structure may be deposited in the first filling region 120 and the second filling region 130 through atomic layer deposition process. The initial support structure is formed on the sidewalls of the first filling region 120 and the second filling region 130 and on the top surfaces of the initial bit line isolation structure 31 and the first initial dielectric layer 81. Then, the initial support structure located on the top surface of the initial bit line isolation structure 31 and the top surface of the first initial dielectric layer 81 is removed through etching. The initial support structure on both sidewalls of the word line isolation structure 50 and on the sidewalls of the adjacent third parts 413 along the second direction Y is retained as the support structure 110. It should be noted that a material of the support structure 110 may include, but is not limited to, silicon nitride.

In this case, in the step of forming the support structure 110, the retained first initial dielectric layer 81 forms a first transition dielectric layer 83, and the retained initial bit line isolation structure 31 forms the transition bit line isolation structure 32.

In this embodiment, the support structure 110 is formed by using the atomic layer deposition process. This can improve density of a film layer of the support structure 110 to prevent inclination of the third segment of the active pillar in a subsequent word line formation process, and ensure accuracy of the subsequently formed gate oxide layer, thereby improving the performance and the yield of the semiconductor structure.

According to an exemplary embodiment, this embodiment is a further description of step S300 described above.

Figure 9:
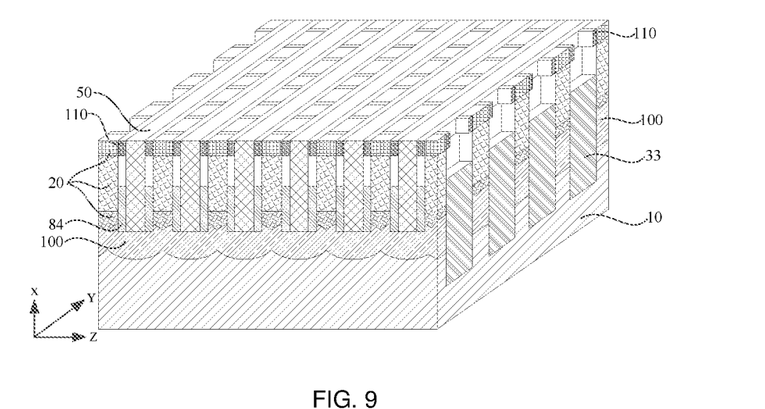
FIG. 9 is a schematic diagram of forming a first intermediate dielectric layer and an intermediate bit line isolation structure in the manufacturing method of a semiconductor structure according to an exemplary embodiment.
Figure 10:
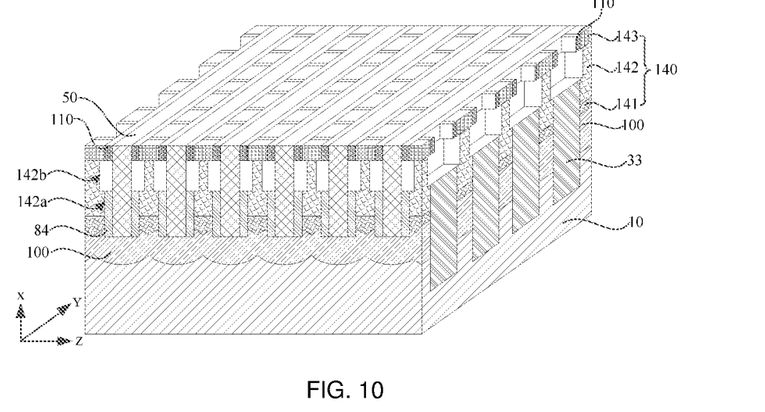
FIG. 10 is a schematic diagram of forming active pillars in the manufacturing method of a semiconductor structure according to an exemplary embodiment.

As shown in FIGS. 9 and 10, after the support structure 110 is formed, the silicon pillar 20 is preprocessed to form the active pillar 140. The preprocessing includes oxidation processing. That is, the middle part of the silicon pillar 20, which is equivalent to the second part 412 of the silicon pillar structure 41, is oxidized, and then is etched or cleaned to form the active pillar 140.

In an embodiment, after a part of the second part 412 is oxidized, the cross-sectional area of the oxidized part of second part 412 is decreased. And, the cross-sectional area of the unoxidized part of the second part 412 remains unchanged, such that after the oxidization, the silicon pillar 20 forms the active pillar 140.

As shown in FIG. 9, in an embodiment, before the second part 412 of the silicon pillar 20 is partially oxidized, a part of the first transition dielectric layer 83 and a part of the transition bit line isolation structure 32 are removed through etching along the direction opposite to the first direction X (with reference to the direction in FIG. 9). The etching endpoint in this step is located at one-third to two-thirds of the height of the second part 412 of the silicon pillar 20, exposing a part of the second part 412. In an example, the etching endpoint of the first transition dielectric layer 83 and the transition bit line isolation structure 32 may be half the height of the second part 412. It should be noted that, in this step, the upper half of the second part 412 may subsequently form the second sub-segment 142b of the second segment 142 in the active pillar 140, and the lower half of the second part 412 may subsequently form the first sub-segment 142a of the second segment 142 in the active pillar 140.

After the part of the first transition dielectric layer 83 and the part of the transition bit line isolation structure 32 are etched, the exposed second part 412 of the silicon pillar 20 is oxidized to remove a part of the second part 412 along a radial direction of the silicon pillar 20. It should be noted that in some embodiments, the oxidation processing includes thermal oxidation or steam oxidation. In the oxidation processing, the second part 412 of the silicon pillar 20 is exposed outside. Through thermal oxidation or steam oxidation, an oxide layer, such as silicon oxide, is formed on a surface of the second part 412, and then can be removed through etching or cleaning, to remove the part of the second part 412 of the silicon pillar 20.

After the oxidation process is completed, the lower half of the silicon pillar 20 forms the first segment 141 of the active pillar 140, and the first segment 141 may form a drain or a source. The middle segment of the silicon pillar 20 forms the second segment 142 of the active pillar 140, and the second segment 142 may form a channel region. The upper half of the silicon pillar 20 forms the third segment 143 of the active pillar 140, and the third segment 143 may form a source or a drain. In this case, the oxidized part of the middle segment of the silicon pillar 20 forms the second sub-segment 142b of the second segment 142, and the unoxidized part of the middle segment of the silicon pillar 20 forms the first sub-segment 142a of the second segment 142. It should be noted that, along the first direction X, the first sub-segment 142a is as long as the second sub-segment 142b. In an embodiment, the first segment 141 forms the drain, and the third segment 143 forms the source. Therefore, after the oxidation process, taking a plane perpendicular to the first direction X as a cross-section, the cross-sectional area of the first sub-segment 142a is larger than that of the second sub-segment 142b, such that word line structures with different thicknesses are formed at positions corresponding to the first sub-segment 142a and the second sub-segment 142b respectively.

It should be noted that, after the oxidization, the retained first transition dielectric layer 83 forms the first intermediate dielectric layer 84, and the retained transition bit line isolation structure 32 forms the intermediate bit line isolation structure 33.

According to an exemplary embodiment, this embodiment is a further description of step S400 described above.

Figure 11:
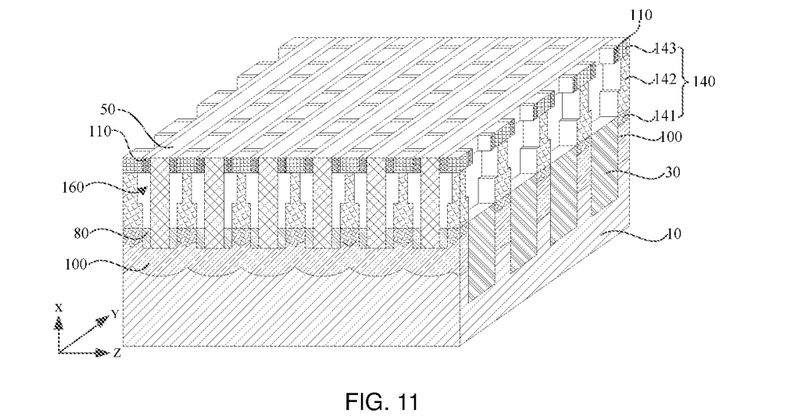
FIG. 11 is a schematic diagram of forming a first dielectric layer and a bit line isolation structure in the manufacturing method of a semiconductor structure according to an exemplary embodiment.
Figure 12:
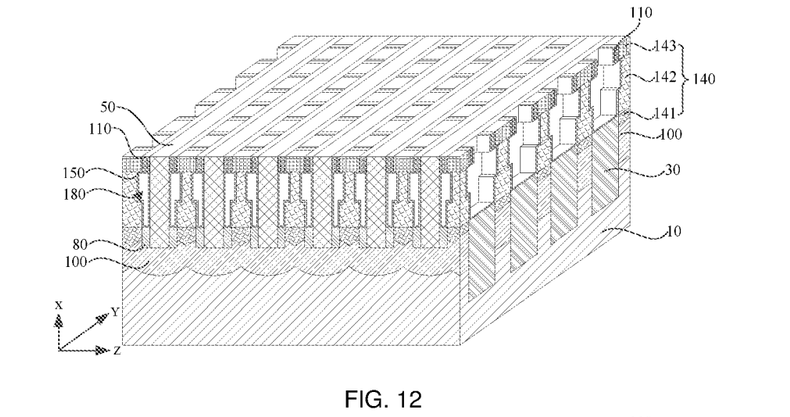
FIG. 12 is a schematic diagram of forming a gate oxide layer in a manufacturing method of a semiconductor structure according to an exemplary embodiment.

As shown in FIGS. 11 and 12, the first gate oxide layer 150 is formed on the sidewall of the second segment 142 and the bottom surface of the third segment 143.

The gate oxide layer 150 may be formed by using the following method.

With reference to FIG. 11, the first intermediate dielectric layer 84 and the intermediate bit line isolation structure 33 are partially removed through etching, to expose the entire second segment 142. A second trench 160 is formed between the exposed second segment 142 and the adjacent word line isolation structure 50, and the top of the second trench 160 exposes the bottom surface of the third segment 143. In this step, the retained first intermediate dielectric layer 84 forms the first dielectric layer 80, and the retained intermediate bit line isolation structure 33 forms a bit line isolation structure 30.

With reference to FIG. 12, the gate oxide layer 150 is formed on the sidewall of the second trench 160 by using the atomic layer deposition process. It should be noted that the gate oxide layer 150 formed in this step surrounds the sidewall of the second segment 142. In this case, the top surface of the gate oxide layer 150 partially covers the bottom surface of the third segment 143.

In this embodiment, the atomic layer deposition process is characterized by a low deposition rate, a high density of a deposited film layer, and good step coverage. The gate oxide layer 150 formed by using the atomic layer deposition can effectively isolate and protect the second segment 142, namely, the gate, of the active pillar 140 when the first gate oxide layer is thin, and can avoid occupying large space, thereby facilitating subsequent filling or formation of another structure layer. A material of the gate oxide layer 150 may include, but is not limited to, silicon dioxide, silicon monoxide, hafnium oxide, or titanium oxide.

According to an exemplary embodiment, this embodiment is a further description of step S500 described above.

As shown in FIGS. 12 to 19, the word line structure 170 is formed on a sidewall of the first gate oxide layer 150.

Figure 13:
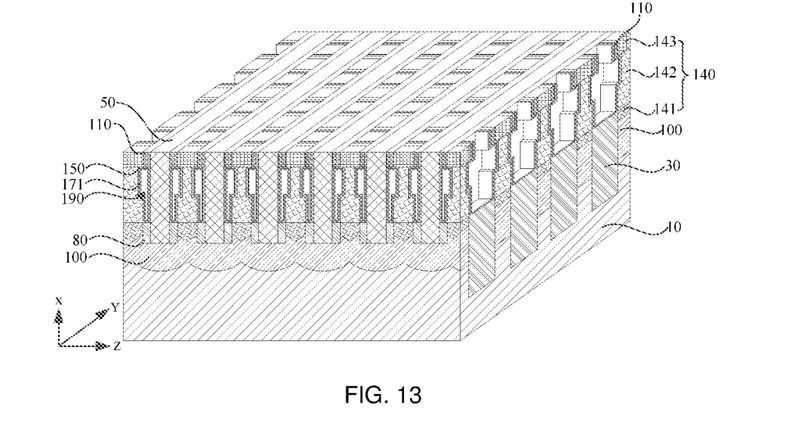
FIG. 13 is a schematic diagram of forming a first word line in the manufacturing method of a semiconductor structure according to an exemplary embodiment.

In some embodiments, the word line structure 170 may be formed by using the following method:

With reference to FIGS. 12 and 13, after the gate oxide layer 150 is formed, the gate oxide layer 150 located in the second trench 160 forms a third trench 180. A first initial word line (not shown in the figure) is formed in the third trench 180 by using the atomic layer deposition process. The first initial word line is formed outside the entire sidewall of the gate oxide layer 150. Then, along the first direction X, the first initial word line on the bit line isolation structure 30 is removed partially through etching. The etching endpoint of the first initial word line is flush with the top surface of the gate oxide layer 150 on the top surface of the bit line isolation structure 30, thereby cutting off the first initial word line, such that the first initial word lines form a plurality of first word lines 171 arranged at intervals along the second direction Y.

The material of the first word line 171 may include, but is not limited to, titanium nitride. In this step, the first word line 171 in the third trench 180 forms the fourth trench 190.

Figure 14:
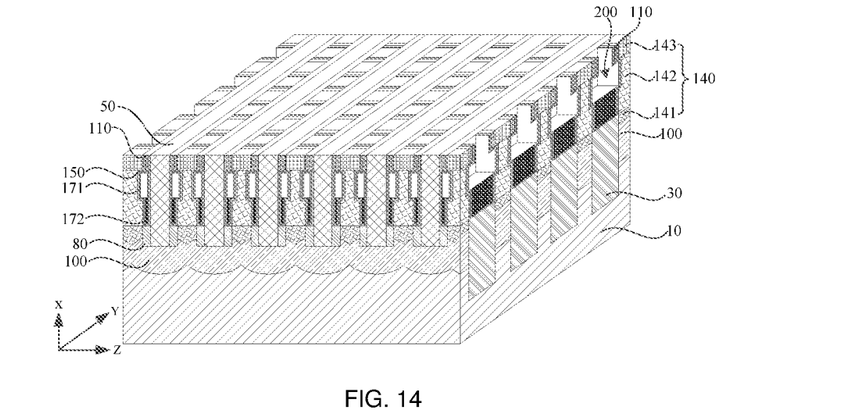
FIG. 14 is a schematic diagram of forming a second word line in the manufacturing method of a semiconductor structure according to an exemplary embodiment.

With reference to FIG. 14, a second initial word line (not shown in the figure) is formed in the fourth trench 190 by using the atomic layer deposition process, the physical vapor deposition process, or the chemical vapor deposition process. The second initial word line fills up the fourth trench 190, and then a part of the second initial word line is removed through etching. The retained second initial word line forms the second word line 172. The etching endpoint of the second initial word line is flush with the junction between the first sub-segment 142a and the second sub-segment 142b, that is, the etching endpoint of the second initial word line is flush with the top surface of the first sub-segment 142a.

A material of the second word line 172 may include, but is not limited to, tungsten or polycrystalline silicon. In this step, a fifth trench 200 is formed between the top surface of the second word line 172 and the sidewall of the first word line 171.

Figure 15:
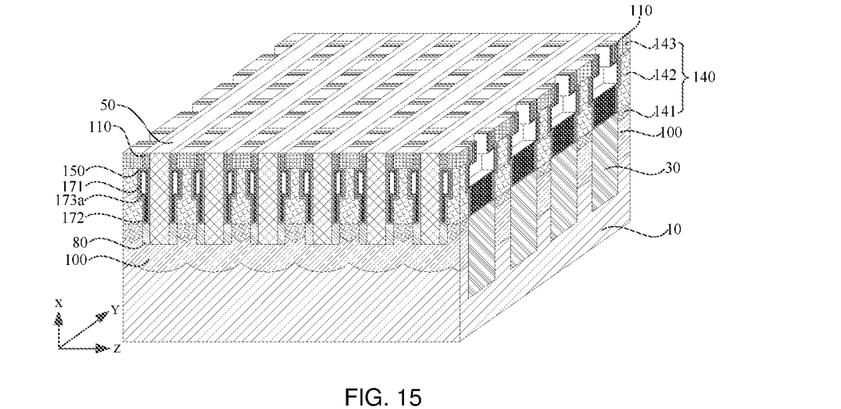
FIG. 15 is a schematic diagram of forming a third initial word line in the manufacturing method of a semiconductor structure according to an exemplary embodiment.
Figure 16:
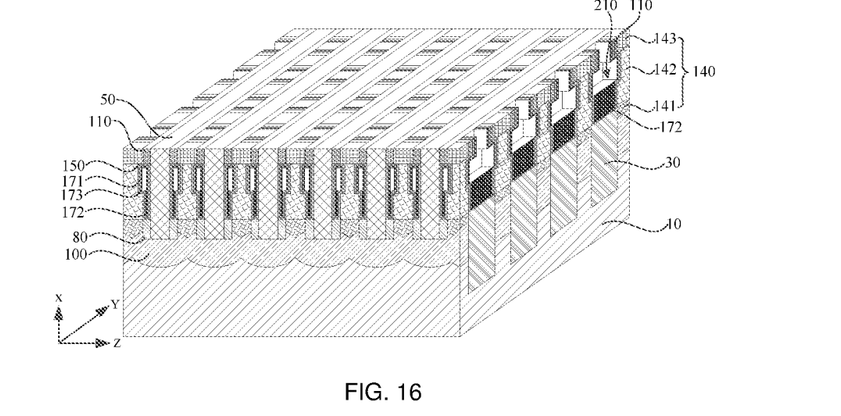
FIG. 16 is a schematic diagram of forming a third word line in the manufacturing method of a semiconductor structure according to an exemplary embodiment.

With reference to FIGS. 15 and 16, a third initial word line 173a is formed on the sidewall of the fifth trench 200 by using the atomic layer deposition process, the physical vapor deposition process, or the chemical vapor deposition process. Then, the third initial word line 173a is partially removed through etching, to expose the top surface of the second word line 172. The retained third initial word line 173a forms the third word line 173.

The material of the third word line 173 may include, but is not limited to, titanium nitride. In this step, the sixth trench 210 is formed between the sidewall of the third word line 173 and the top surface of the second word line 172 in the fifth trench 200.

Figure 17:
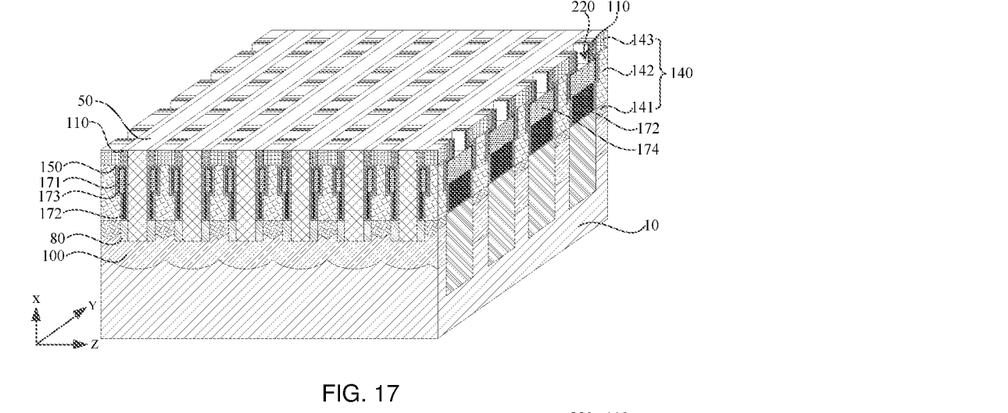
FIG. 17 is a schematic diagram of forming a fourth word line in the manufacturing method of a semiconductor structure according to an exemplary embodiment.

With reference to FIG. 17, a fourth initial word line (not shown in the figure) is formed in the sixth trench 210 by using the atomic layer deposition process, the physical vapor deposition process, or the chemical vapor deposition process. The fourth initial word line fills up the sixth trench 210. Then, the fourth initial word line is partially removed through etching. The etching endpoint of the fourth initial word line is flush with the top surface of the second segment 142, and the retained fourth initial word line forms a fourth word line 174. A material of the fourth word line 174 may include, but is not limited to, tungsten or polycrystalline silicon.

Figure 19:
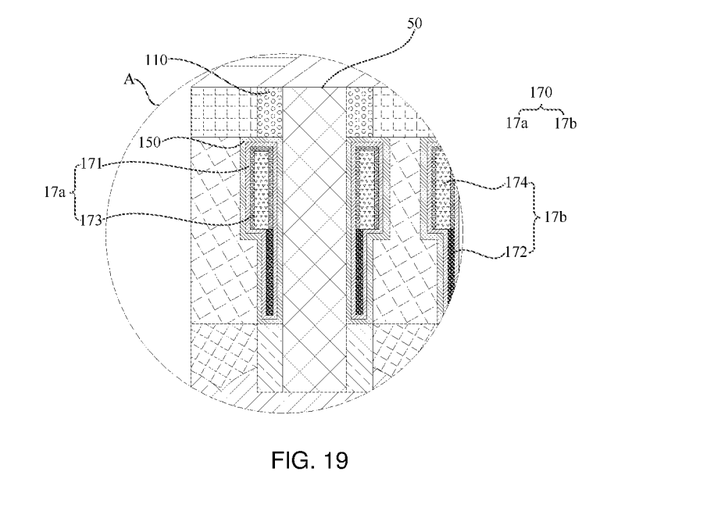
FIG. 19 is an enlarged view of a part A in FIG. 18.

In this embodiment, as shown in FIG. 19, the first word line 171 and the third word line 173 form the first word line structure 17a, and the second word line 172 and the fourth word line 174 form the second word line structure 17b. The first word line structure 17a and the second word line structure 17b form a word line structure 170.

In an embodiment, the first word line 171 and the third word line 173 in the first word line structure 17a are both made of titanium nitride. The second word line 172 and the fourth word line 174 in the second word line structure 17b are both made of metal tungsten or polysilicon. Because the materials of the first word line structure 17a and the second word line structure 17b are different, they form a gate structure of which a function conforms to a dual work function.

Figure 18:
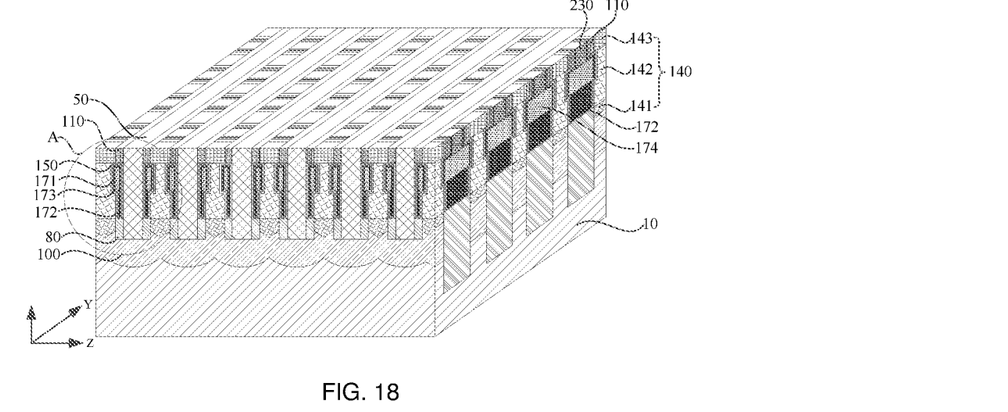
FIG. 18 is a schematic diagram of forming a second dielectric layer in a manufacturing method of a semiconductor structure according to an exemplary embodiment.

With reference to FIGS. 17 to 19, after the word line structure 170 is formed, a plane parallel to the first direction X is taken as a longitudinal section. The longitudinal section of the first word line structure 17a is in a large-top and small-bottom shape. The longitudinal cross-sectional of the second word line structure 17b is in a small-top and large-bottom shape. Therefore, a part of the first word line structure 17a adjacent to the third segment 143 (the source) is thicker than the part adjacent to the first segment 141 (the drain), while a part of the second word line structure 17b adjacent to the third segment 143 (the source) is thinner than the part adjacent to the first segment 141 (the drain). The thickness of the first word line structure 17a made of titanium nitride material affects the potential, while the thickness of the second word line structure 17b made of metal tungsten or polysilicon does not affect the potential. Therefore, when a transistor formed by the semiconductor structure in this embodiment, such as a GAA transistor, is used, the potential of the word line structure 170 adjacent to the third segment 143 at the gate is larger than that of the word line structure 170 adjacent to the first segment 141, resulting an increase in the turn-on voltage VT applied to the terminal of the gate close to the source, which increases a source voltage Vs at the terminal of source. A relationship shown in the following formula exists between the turn-off current (I off) and the source voltage Vs, namely:

$$I_{off} \propto e^{-(V_s * \varepsilon/kt)}$$

where ε/kt represents a constant, which is about 0.0256. Therefore, if the source voltage Vs of the source increases, the turn-off current (I off) decreases. Because the turn-off current and the source voltage Vs satisfy the exponential relationship of e, when the potential of the gate adjacent to the terminal of the source is higher than that adjacent to terminal of the drain, the turn-off current decreases exponentially, to facilitate the control of the turn-off current of the semiconductor structure, thereby reducing the GIDL current and inter-band tunneling of the semiconductor structure and improving the performance and the yield of the semiconductor structure.

As shown in FIG. 18, in some embodiments, after the word line structure 170 is formed, a third filling region 220 is formed between the top surface of the fourth word line 174 and the support structure 110.

A second dielectric layer 230 is formed in the third filling region 220 by using atomic layer deposition process, the physical vapor deposition process, or the chemical vapor deposition process. Then, the top surface of the second dielectric layer 230 is processed through chemical mechanical polishing, such that the top surface of the retained second dielectric layer 230 is flush with the top surface of the active pillar 140. The second dielectric layer 230 is formed on the top surface of the fourth word line 174, which facilitates subsequently forming another structure of the semiconductor structure on the substrate 10. A material of the second dielectric layer 230 includes, but is not limited to, silicon nitride, silicon dioxide, or silicon oxynitride.

As shown in FIG. 18, an exemplary embodiment of the present disclosure provides a semiconductor structure. The semiconductor structure includes a substrate 10, an active pillar 140, a gate oxide layer 150, and a word line structure 170.

For example, a plurality of active pillars 140 are provided and are arranged in an array in the substrate 10. Along the first direction X, the active pillar 140 includes a first segment 141, a second segment 142, and a third segment 143 connected sequentially. The second segment 142 includes a first sub-segment 142a and a second sub-segment 142b connected sequentially. The bottom surface of the first segment 141 is connected to the substrate 10. The bottom surface of the first sub-segment 142a is connected to the top surface of the first segment 141. The top surface of the second sub-segment 142b is connected to the bottom surface of the third segment 143. Therefore, taking a plane perpendicular to the first direction X as a cross section, the cross-sectional area of the second sub-segment 142b is smaller than that of the first sub-segment 142a.

The gate oxide layer 150 is disposed on a sidewall of the second segment 142 and on a bottom surface of the third segment 143.

The word line structure 170 surrounds the second segment 142 of the active pillar 140, such that a GAA transistor structure can be formed. The word line structure 170 includes a first word line structure 17*a* and a second word line structure 17*b*. The first word line structure 17*a* is connected to the sidewall of the gate oxide layer 150, and the first word line structure 17*a* covers a second word line structure 17*b*. The first word line structure 17*a* and the second word line structure 17*b* are made of different materials.

In the semiconductor structure of this embodiment, the gate oxide layer is formed on the sidewall of the second segment and the bottom surface of the third segment. The first word line structure and the second word line structure that are made of different materials are disposed on the gate oxide layer. The word line structures covering the first sub-segment and the second sub-segment respectively have different thicknesses, such that potentials at two ends of the second segment are different, which is beneficial to controlling the turn-off current of the semiconductor structure, and reducing the problems of GIDL and inter-band tunneling, thereby effectively improving the performance and yield of the semiconductor structure.

As shown in FIG. 18, in some embodiments, the first word line structure 17*a* includes a first word line 171 and a third word line 173. The first word line 171 is disposed on the sidewall of the gate oxide layer 150. The third word line 173 is disposed on the sidewall of the first word line 171 and is opposite to the second sub-segment 142*b*.

The second word line structure 17*b* includes a second word line 172 and a fourth word line 174. The second word line 172 is located on the sidewall of the first word line 171 and is opposite to the first sub-segment 142*a*. The fourth word line 174 is disposed on the sidewall of the third word line 173 and is opposite to the second sub-segment 142*b*. Along the first direction X, the second word line 172 is connected to the fourth word line 174.

A second dielectric layer 230 is disposed on the top surface of the fourth word line 174 to facilitate subsequent formation of another structure of the semiconductor structure on the substrate 10.

As shown in FIG. 18, in some embodiments, the semiconductor structure further includes a bit line isolation structure 30 and a word line isolation structure 50.

A plurality of bit line isolation structures 30 are provided, and are arranged at intervals along the second direction Y The bit line isolation structure 30 is located between the second word line structure 17*b* and the substrate 10. The bit line isolation structure 30 is configured to insulate bit lines formed subsequently in the substrate 10.

A plurality of word line isolation structures 50 are provided, and are arranged at intervals along the third direction Z. The word line isolation structure 50 is located between adjacent word line structures 170 to insulate adjacent word line structures 170.

As shown in FIG. 18, in some embodiments, the semiconductor structure further includes a bit line 100. The bit line 100 is located below the active pillar 140. The plurality of bit lines 100 are arranged at intervals along the second direction Y The bit line 100 is connected to first segments 141 of a plurality of active pillars 140 that are along a third direction Z and in a same straight line. A first dielectric layer 80 is disposed between the bit line 100 and the word line structure 170.

As shown in FIG. 18, in some embodiments, the semiconductor structure further includes a support structure 110. The support structure 110 is located at both sides of the word line structure 170 and on the sidewall of the third segment 143 of the active pillar 140 extending along the third direction Z. The support structure 110 facilitates subsequent formation of the active pillar 140 and improves accuracy of forming the gate oxide layer 150 on the second segment 142 of the active pillar 140.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A manufacturing method of a semiconductor structure, comprising:
   providing a substrate;
   forming silicon pillars on the substrate, wherein the silicon pillars are arranged in an array;
   pre-processing the silicon pillar, to form an active pillar, wherein along a first direction, the active pillar comprises a first segment, a second segment, and a third segment that are connected sequentially, and the second segment comprises a first sub-segment and a second sub-segment that are connected sequentially, and along a second direction, a cross-sectional area of the second sub-segment is smaller than that of the first sub-segment;
   forming a gate oxide layer on a sidewall of the second segment and a bottom surface of the third segment; and
   forming a word line structure on a sidewall of the gate oxide layer, wherein the word line structure surrounds the second segment and comprises a first word line structure and a second word line structure that are connected sequentially along the first direction, the first word line structure is connected to the sidewall of the gate oxide layer and covers the second word line structure, and the first word line structure and the second word line structure are made of different materials.

2. The manufacturing method of a semiconductor structure according to claim 1, wherein the forming silicon pillars on the substrate comprises:
forming a plurality of bit line isolation structures in the substrate, wherein the bit line isolation structures are disposed at intervals along the second direction, and the substrate between adjacent two of the bit line isolation structures forms a strip body;
processing the strip body to form a silicon pillar structure, wherein the silicon pillar structure comprises a first part, a second part, and a third part that are connected sequentially along the first direction; and
forming a plurality of word line isolation structures in the substrate, wherein the plurality of word line isolation structures are disposed at intervals along a third direction, the second direction intersects the third direction on a same horizontal plane, and the silicon pillar structure between adjacent two of the bit line isolation structures and between adjacent two of the word line isolation structures forms the silicon pillar.

3. The manufacturing method of a semiconductor structure according to claim 2, wherein the forming a plurality of bit line isolation structures in the substrate comprises:
forming bit line trenches disposed at intervals along the second direction in the substrate;
forming an initial bit line isolation structure in the bit line trench; and
removing a part of the initial bit line isolation structure, and taking the retained initial bit line isolation structure as the bit line isolation structure.

4. The manufacturing method of a semiconductor structure according to claim 3, wherein the forming a plurality of word line isolation structures in the substrate comprises:
forming word line trenches disposed at intervals along the third direction in the substrate, wherein along the first direction, the word line trench is shallower than the bit line trench;
forming a first initial dielectric layer on each of two sidewalls of the word line trench, wherein the first initial dielectric layer extends outside the word line trench, and covers a top surface of the silicon pillar structure, and a first trench is formed between the adjacent first initial dielectric layers in the word line trench;
forming the word line isolation structure in the first trench; and
removing a part of the first initial dielectric layer to expose the top surface of the silicon pillar structure.

5. The manufacturing method of a semiconductor structure according to claim 4, the manufacturing method further comprises:
forming a bit line at a bottom of the first trench, wherein the bit lines are disposed at intervals along the second direction.

6. The manufacturing method of a semiconductor structure according to claim 4, the manufacturing method further comprises:
forming a support structure, wherein the support structure covers two sides of the word line isolation structure and two sidewalls of the third part extending along the third direction.

7. The manufacturing method of a semiconductor structure according to claim 6, wherein the forming a support structure comprises:
removing a part of the first initial dielectric layer and a part of the initial bit line isolation structure to expose a part of the word line isolation structure and a part of the silicon pillar structure, wherein along the third direction, a first filling region is formed between the word line isolation structure and the silicon pillar structure, and along the second direction, a gap between adjacent two of the third parts forms a second filling region; and
forming the support structure in the first filling region and on a sidewall of the second filling region, wherein the retained first initial dielectric layer forms a first transition dielectric layer, and the retained initial bit line isolation structure forms a transition bit line isolation structure.

8. The manufacturing method of a semiconductor structure according to claim 7, wherein the pre-processing the silicon pillar, to form an active pillar comprises:
removing a part of the first transition dielectric layer and a part of the transition bit line isolation structure, to expose a part of the second part; and
oxidizing the exposed part of the second part, to remove a part of the second part, wherein the oxidized second part forms the second sub-segment of the second segment of the active pillar, the unoxidized second part forms the first sub-segment of the second segment, the first part forms the first segment, the third part forms the third segment, the retained first transition dielectric layer forms a first intermediate dielectric layer, and the retained transition bit line isolation structure forms an intermediate bit line isolation structure.

9. The manufacturing method of a semiconductor structure according to claim 8, wherein the forming a gate oxide layer on a sidewall of the second segment and a bottom surface of the third segment comprises:
removing a part of the first intermediate dielectric layer and a part of the intermediate bit line isolation structure, to expose the second segment, wherein a second trench is formed between the word line isolation structure and the second segment; and
forming the gate oxide layer on the sidewall of the second trench through an atomic layer deposition process, wherein the gate oxide layer in the second trench forms a third trench, the retained first intermediate dielectric layer forms a first dielectric layer, and the retained intermediate bit line isolation structure forms the bit line isolation structure.

10. The manufacturing method of a semiconductor structure according to claim 9, wherein the forming a word line structure on a sidewall of the gate oxide layer comprises:
forming a first word line on a sidewall of the third trench, wherein the first word line in the third trench forms a fourth trench;
forming a second word line in the fourth trench, wherein a top surface of the second word line is flush with a top surface of the first sub-segment, and a sidewall of the first word line in the fourth trench and the top surface of the second word line form a fifth trench;
forming a third initial word line on a sidewall of the fifth trench, and removing a part of the third initial word line, to expose the top surface of the second word line, wherein the retained third initial word line forms a third word line, and the third word line in the fifth trench forms a sixth trench; and
forming a fourth word line in the sixth trench, wherein a top surface of the fourth word line is flush with a top surface of the second segment, and a third filling region is formed between the top surface of the fourth word line and the support structure; and the first word line and the third word line form the first word line structure, and the second word line and the fourth word line form the second word line structure.

11. The manufacturing method of a semiconductor structure according to claim 10, the manufacturing method further comprises:

forming a second dielectric layer in the third filling region.

12. A semiconductor structure, comprising:

a substrate;

active pillars, arranged as an array in the substrate, wherein along a first direction, the active pillar comprises a first segment, a second segment, and a third segment that are connected sequentially, the second segment comprises a first sub-segment and a second sub-segment that are connected sequentially, and along a second direction, a cross-sectional area of the second sub-segment is smaller than that of the first sub-segment;

a gate oxide layer, disposed on a sidewall of the second segment and a bottom surface of the third segment; and a word line structure, wherein the word line structure surrounds the second segment and comprises a first word line structure and a second word line structure, the first word line structure is connected to a sidewall of the gate oxide layer and covers the second word line structure, and the first word line structure and the second word line structure are made of different materials;

bit lines, wherein the bit line is located below the active pillar, the bit lines are disposed at intervals along the second direction, and a first dielectric layer is disposed between the bit line and the word line structure.

13. The semiconductor structure according to claim 12, wherein the first word line structure comprises a first word line and a third word line, the first word line is disposed on the sidewall of the gate oxide layer, and the third word line is disposed on a sidewall of the first word line and is opposite to the second sub-segment; and the second word line structure comprises a second word line and a fourth word line, the second word line is located on the sidewall of the first word line and is opposite to the first sub-segment, the fourth word line is disposed on a sidewall of the third word line and is opposite to the second sub-segment, the second word line is connected to the fourth word line, and a second dielectric layer is disposed on a top surface of the fourth word line.

14. The semiconductor structure according to claim 12, the semiconductor structure further comprises bit line isolation structures and word line isolation structures, wherein the bit line isolation structures are disposed at intervals along the second direction, and the bit line isolation structure is located between the second word line structure and the substrate; and the word line isolation structures are disposed at intervals along a third direction, and the word line isolation structure is located between adjacent two of the word line structures.

15. The semiconductor structure according to claim 12, the semiconductor structure further comprises a support structure, wherein the support structure is located at each of two sides of the word line structure and on each of two sidewalls of the third segment along a third direction.

* * * * *